United States Patent [19]

Deschamps

[11] Patent Number: 5,343,157

[45] Date of Patent: Aug. 30, 1994

[54] METHOD AND APPARATUS FOR MEASURING AN UNKNOWN CAPACITANCE USING A KNOWN REFERENCE CAPACITANCE

[75] Inventor: Hervé Deschamps, Suresnes, France

[73] Assignee: Marelli Autronica, Nanterre, France

[21] Appl. No.: 870,468

[22] Filed: Apr. 17, 1992

[30] Foreign Application Priority Data

Apr. 18, 1991 [FR] France ................... 91 04786

[51] Int. Cl.$^5$ .................................. G01R 27/26
[52] U.S. Cl. .................................. 324/678; 324/679
[58] Field of Search ............... 324/672, 676, 678, 679; 340/620; 73/304 C

[56] References Cited

U.S. PATENT DOCUMENTS

| | | | |
|---|---|---|---|
| 3,886,447 | 5/1975 | Tanaka | 324/678 |
| 4,187,460 | 2/1980 | Dauge et al. | 324/678 |
| 4,636,714 | 1/1987 | Allen | 324/678 |
| 4,743,837 | 5/1988 | Herzog | 324/678 X |

FOREIGN PATENT DOCUMENTS 62-32372  2/1987  Japan .................. 324/678

*Primary Examiner*—Walter E. Snow
*Assistant Examiner*—Glenn W. Brown

*Attorney, Agent, or Firm*—Jacobson, Price, Holman & Stern

[57] ABSTRACT

A method and apparatus for measuring an unknown capacitance using a known reference capacitance, wherein a first electrode of the unknown capacitance is connected to ground. The apparatus includes a first device for precharging the unknown capacitance to a first predetermined potential; a second device for selectively charging a first electrode of the reference capacitance to the same potential as the second electrode of the unknown capacitance, without changing the potential on the second electrode of the unknown capacitance; a first switch for selectively electrically connecting the first electrode of the reference capacitance to the second electrode of the unknown capacitance; a third device for switching the potential on the second electrode of the reference capacitance between a first predetermined value and a second predetermined value; a comparator for comparing the potential on the second electrode of the unknown capacitance to a reference voltage; and a sequencer responsive to the output from the comparator and designed to control the second device, the first switch, and the third device, and for counting the number of times these devices are used. The number of times these devices are used in a particular measuring operation according to the present method, is indicative of the unknown capacitance.

32 Claims, 7 Drawing Sheets

METHOD AND APPARATUS FOR MEASURING AN UNKNOWN CAPACITANCE USING A KNOWN REFERENCE CAPACITANCE

The present invention relates to the field of measuring capacitance.

SUMMARY OF THE INVENTION

An object of the present invention is to propose a novel method and apparatus for measuring capacitance, which are both simple and reliable.

According to the present invention, this object is achieved by a method making use of a reference capacitance in addition to the capacitance to be measured, the method comprising the following steps:

a precharging to a known value a first one of the capacitances having a first electrode connected to ground;

b placing a first electrode of the second capacitance at the same potential as the second electrode of the first capacitance;

c connecting the first electrode of the second capacitance to the second electrode of the first capacitance and switching the potential on the second electrode of the second capacitance between a first known value and a second known value; and d comparing the potential on the second electrode of the first capacitance with a reference value, and iterating above steps b and c so long as the potential on the second electrode of the first capacitance does not cross the reference value, and counting the number of iterations.

According to another advantageous characteristic of the present invention, step a consists in charging the first capacitance to a voltage equal to said first known value.

According to another advantageous characteristic of the present invention, the reference value is equal to said second known value.

According to another advantageous characteristic of the present invention, the method further includes the step consisting in:

e causing the potential on the second electrode of the second capacitance to change in voltage steps from the second known value towards the first known value until the potential on the second electrode of the first capacitance is again detected as crossing the reference value, and counting the number of voltage steps performed.

According to another advantageous characteristic of the present invention, above-mentioned steps a, b, c, d, and e are then reproduced, interchanging said first known value and said second known value.

As explained below, this characteristic makes it possible to cancel the offset voltage of the comparator.

The measuring apparatus of the present invention for implementing the above method comprises:

precharging means suitable for precharging to a known value a first capacitance having a first electrode connected to ground;

voltage copying means suitable for placing a first electrode of a second capacitance to the same potential as the second electrode of the first capacitance;

transfer means suitable for connecting the first electrode of the second capacitance to the second electrode of the first capacitance;

potential changing means suitable for switching the potential on the second electrode of the second capacitance between a first known value and a second known value;

comparator means suitable for comparing the potential on the second electrode of the first capacitance with a reference value; and sequencer means responsive to the output from the comparator means and designed to control the potential copying means, the transfer means, and the potential changing means, and for counting the number of times they are used.

According to another advantageous characteristic of the present invention, the potential changing means are designed to cause the potential on the second electrode of the second capacitance to change in voltage steps, from the second known value towards the first known value.

BRIEF DESCRIPTION OF THE DRAWINGS

An embodiment of the invention is described by way of example with reference to the accompanying drawings, in which.

DETAILED DESCRIPTION

Figure 1:
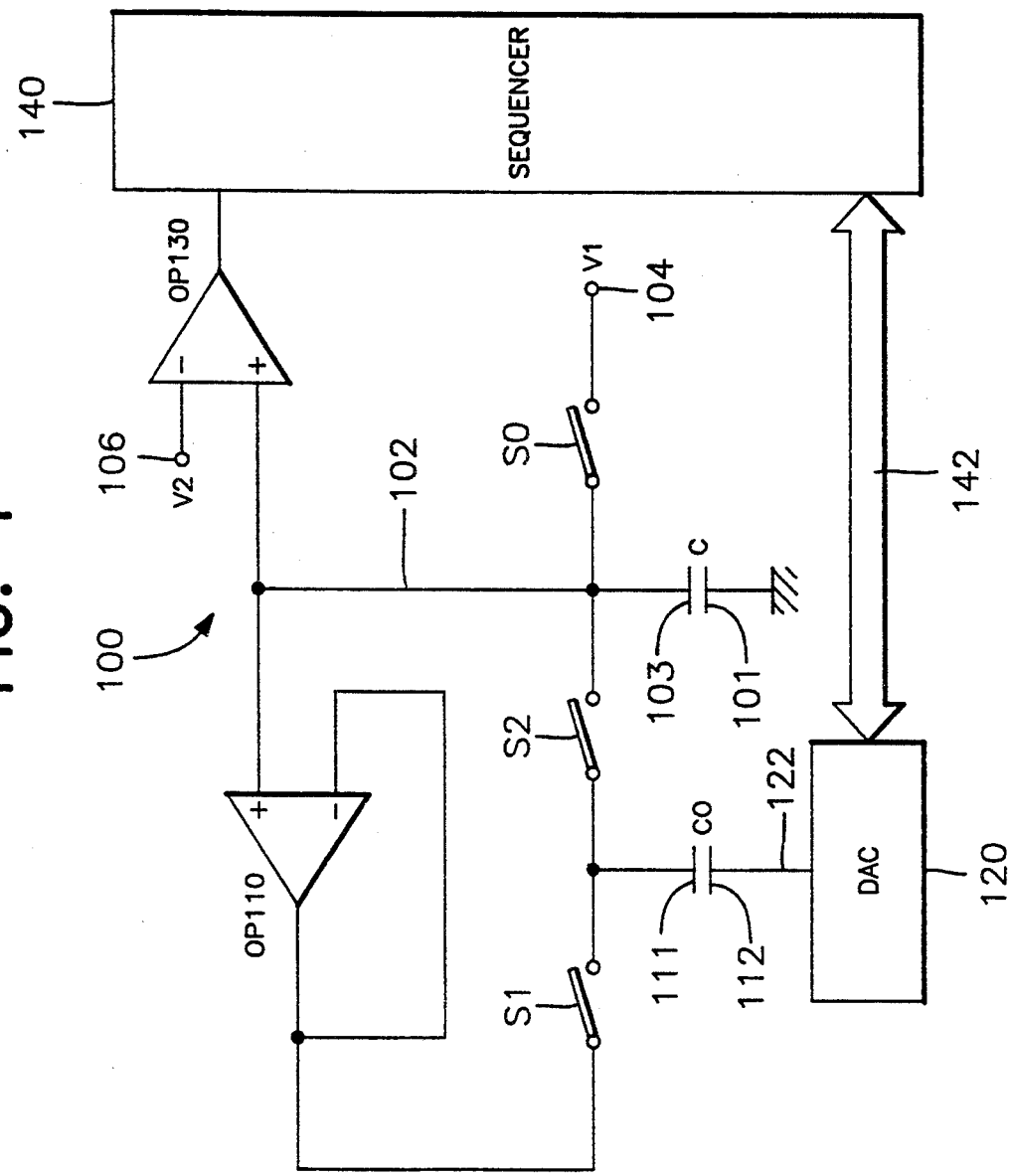
FIG. 1 is a circuit diagram of measuring apparatus in accordance with the present invention.

The description begins with the structure of the measuring apparatus 100 shown in accompanying FIG. 1.

In this figure, the capacitance to be measured is referenced C.

The measuring apparatus 100 includes a reference capacitance C0, three switches S0, S1, and S2, a follower amplifier OP110, a digital-to-analog converter 120, a comparator OP130, and a sequencer 140.

The capacitance C has a first electrode 101 connected to ground and a second electrode 103 connected to a terminal 102.

The switch S0 is connected between the above-mentioned terminal 102 and a positive power supply terminal 104 at a potential V1. Thus, when the switch S0 is closed, the capacitance C is charged to the voltage V1.

The terminal 102 is also connected to the non-inverting input of the operational amplifier OP110. The output of the operational amplifier OP110 is looped back to its inverting input.

The reference capacitance C0 has a first electrode 111 connected to the output of the operational amplifier OP110 via the switch S1, and a second electrode 112 connected to the output 122 of the converter 120.

The first electrode 111 of the reference capacitance C0 is also connected to the terminal 102 via the switch S2, i.e. to the second electrode 103 of the capacitance C being measured.

The terminal 102 is also connected to the non-inverting input of the comparator OP130. The inverting input of the operational amplifier OP130 is connected to a positive power supply terminal 106 at a potential V2. The comparator OP130 thus compares the potential on the terminal 102, i.e. the voltage across the terminals of the capacitance C, with the potential V2.

The reference voltage V2 applied to the comparator OP130 is advantageously greater than the potential V1 present at the terminal 104.

The output of the comparator OP130 is connected to the sequencer 140.

The sequencer controls the digital-to-analog converter 120 via a bus 142. It also controls the closing and opening of the switches S0, S1, and S2 as explained below.

The sequencer 140 thus controls the output voltage of the converter 120 by providing a digital signal on bus 142, which digital signal is indicative of a desired output voltage from the converter 120. This output voltage is applied to the second electrode 112 of the reference capacitance C0 by the converter 120.

The output 122 from the converter 120 can be switched by the sequencer 140 between two predetermined values E1 and E2. In particular, the predetermined values E1 and E2 are converted by the converter 120, from digital signals on the bus 142, to the analog voltages indicated by these digital signals. The voltage E2 is greater than the voltage E1.

The voltages E1 and E2 obtained at the output of the converter 120 are preferably respectively equal to the reference voltage V1 and to the reference voltage V2 as applied to the terminals 104 and 106.

In addition, in a mode of operation under the control of the sequencer 140, the output 122 of the converter 120 can vary in voltage steps between the voltages E1 and E2. If the number of bits on the bus 142 is M, then the size of the above-mentioned voltage steps is equal to $(E2-E1)/(2^M-1)$.

The measuring method in accordance with the present invention is now described with reference to FIGS. 2 to 7.

During a first period for initialization, the switch S0 is closed, while switches S1 and S2 remain open. The initialization period corresponds to step 200 in FIG. 2 and to the period T0 in FIG. 5. The capacitance to be measured C is thus charged to the voltage V1. At the end of the initialization period T0, i.e. at instant T1, the switch S0 is opened. The opening of switch S0 corresponds to step 202 in FIG. 2.

Figure 2:
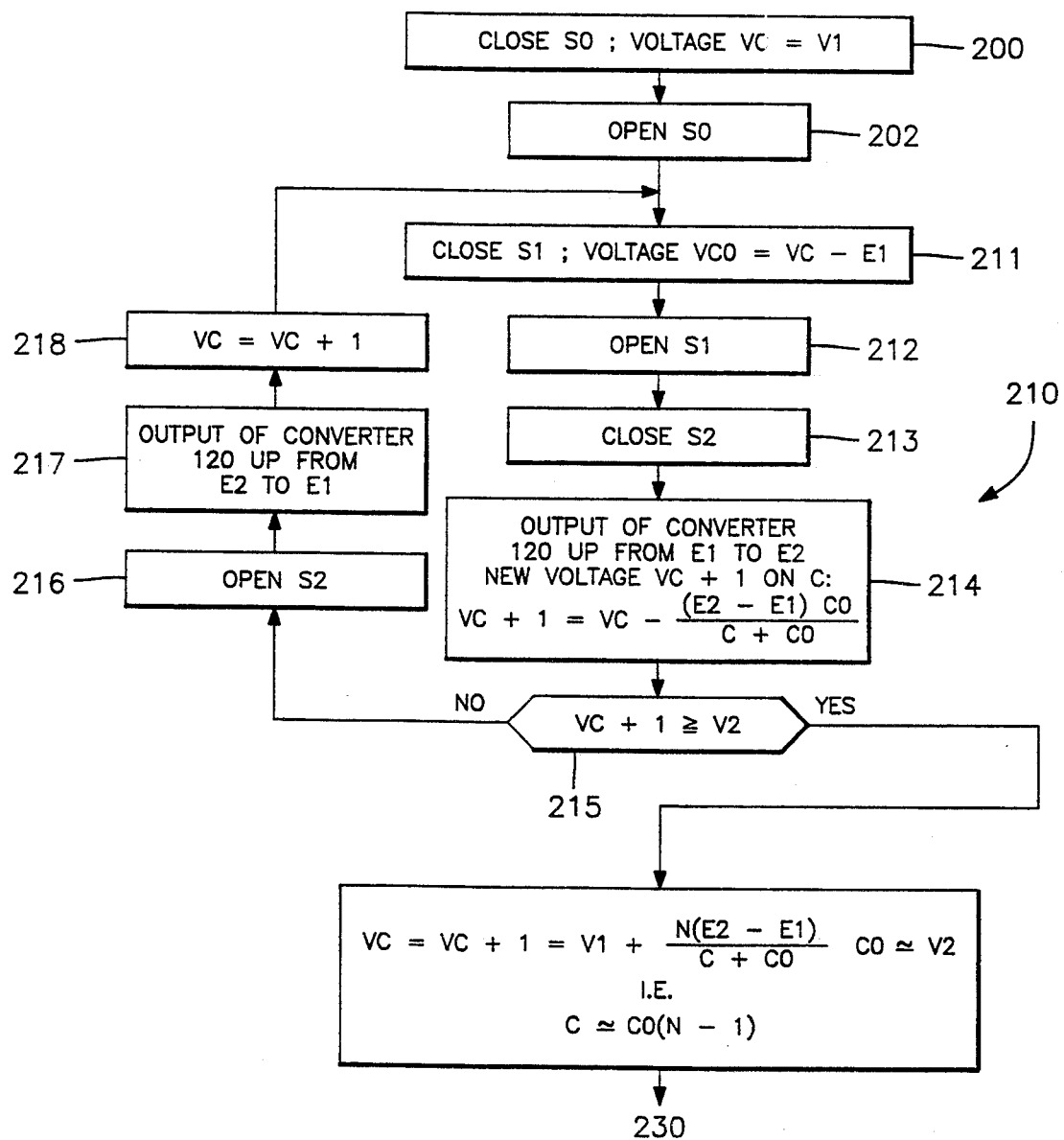
FIGS. 2, 3, and 4 are flow charts showing the measuring method in accordance with the present invention.
Figure 5:
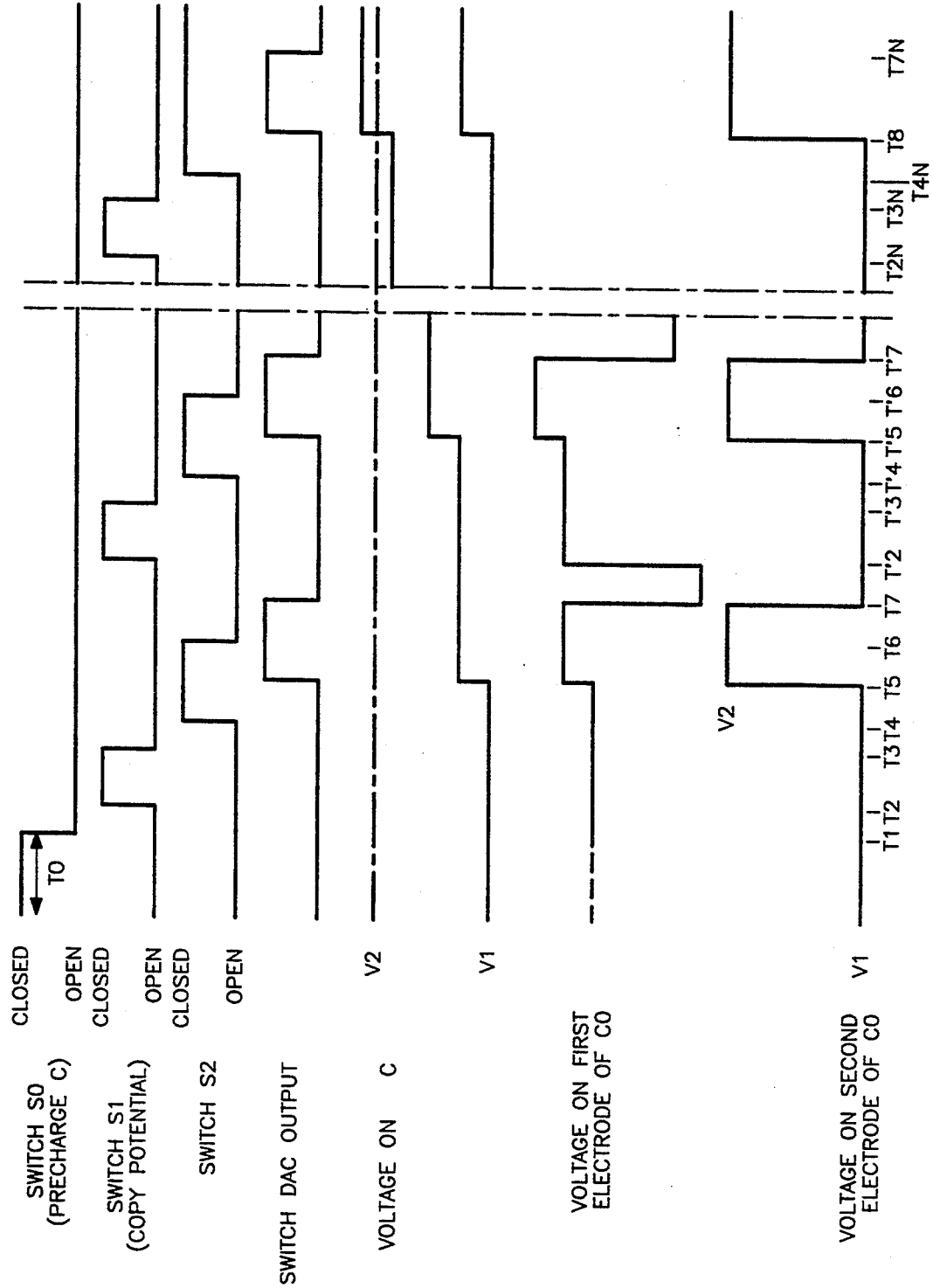
FIGS. 5, 6, and 7 are timing charts showing the operation of apparatus in accordance with the present invention.

The measuring system 100 then runs through a sequence of measuring cycles corresponding to an iteration loop shown as step 210 in FIG. 2. Each measuring cycle comprises in succession a stage during which switch S1 is closed (step 211 in FIG. 2) and then opened (step 212 in FIG. 2), followed by a stage in which switch S2 is closed (step 213 in FIG. 2) and opened (step 216 in FIG. 2). In FIG. 5, the instant at which switch S1 closes is referenced T2, the instant at which switch S1 opens is referenced T3, the instant at which switch S2 closes is referenced T4, and the instant at which switch S2 opens is referenced T6.

In addition, while switch S2 is closed, the sequencer 140 causes the output 122 of the converter 120 to pass from a first voltage E1 to a greater, second voltage E2. This step is shown as step 214 in FIG. 2. In FIG. 5, the instant at which the output from the converter passes from voltage E1 to E2 is referenced T5.

As mentioned above, the first voltage E1 is preferably equal to the voltage V1 at terminal 104 while the second voltage E2 is preferably equal to the voltage V2 at terminal 106.

The first voltage E1 is applied to the second electrode 112 of the reference capacitance C0 while switch S1 is closed between instants T2 and T3.

While switch S1 is closed during step 211 in FIG. 2, the follower amplifier OP110 causes the first electrode 111 of the reference capacitance C0 to be held at the same potential as the second electrode 103 of the capacitance C being measured.

Figure 6:
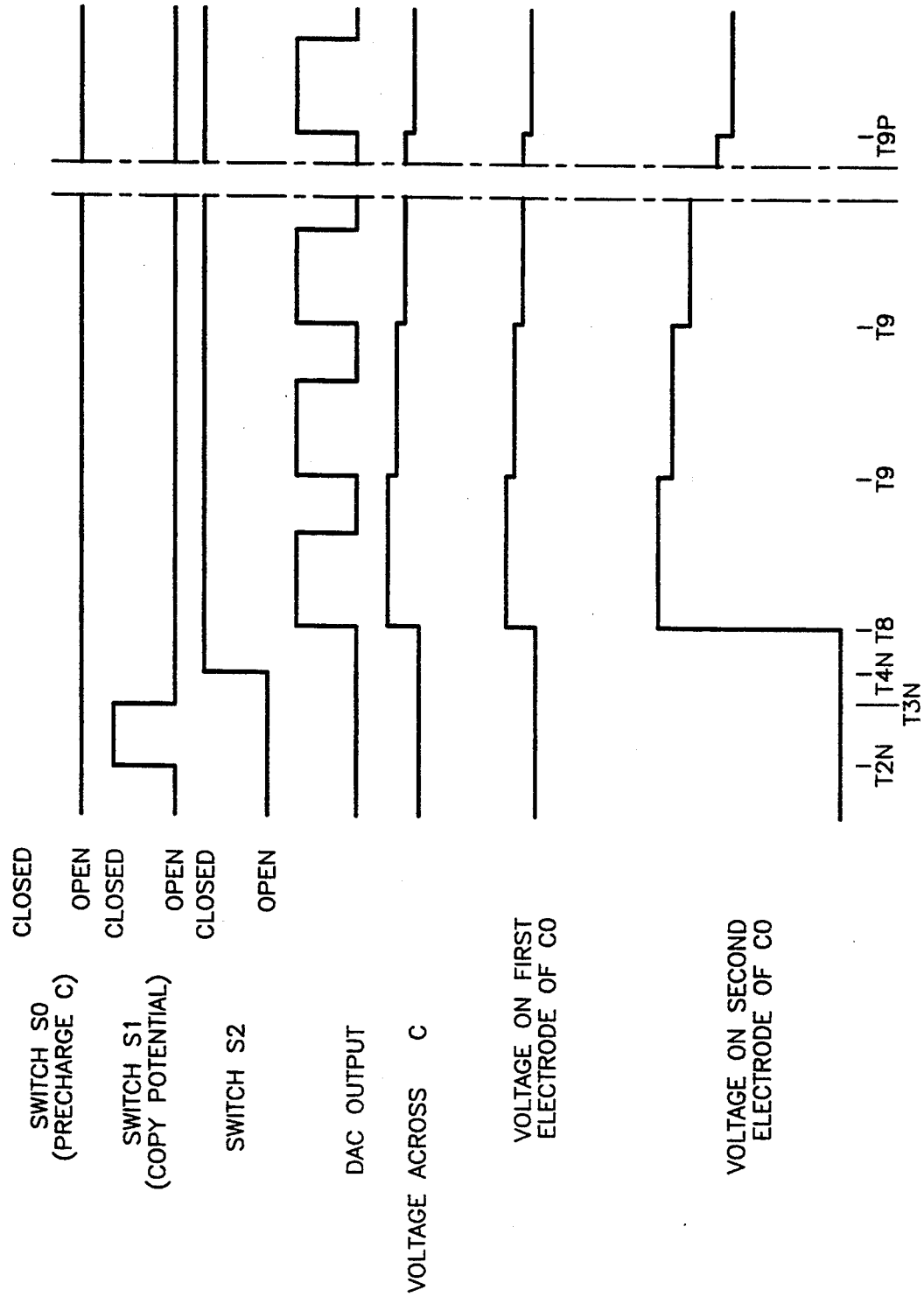
Figure 7:
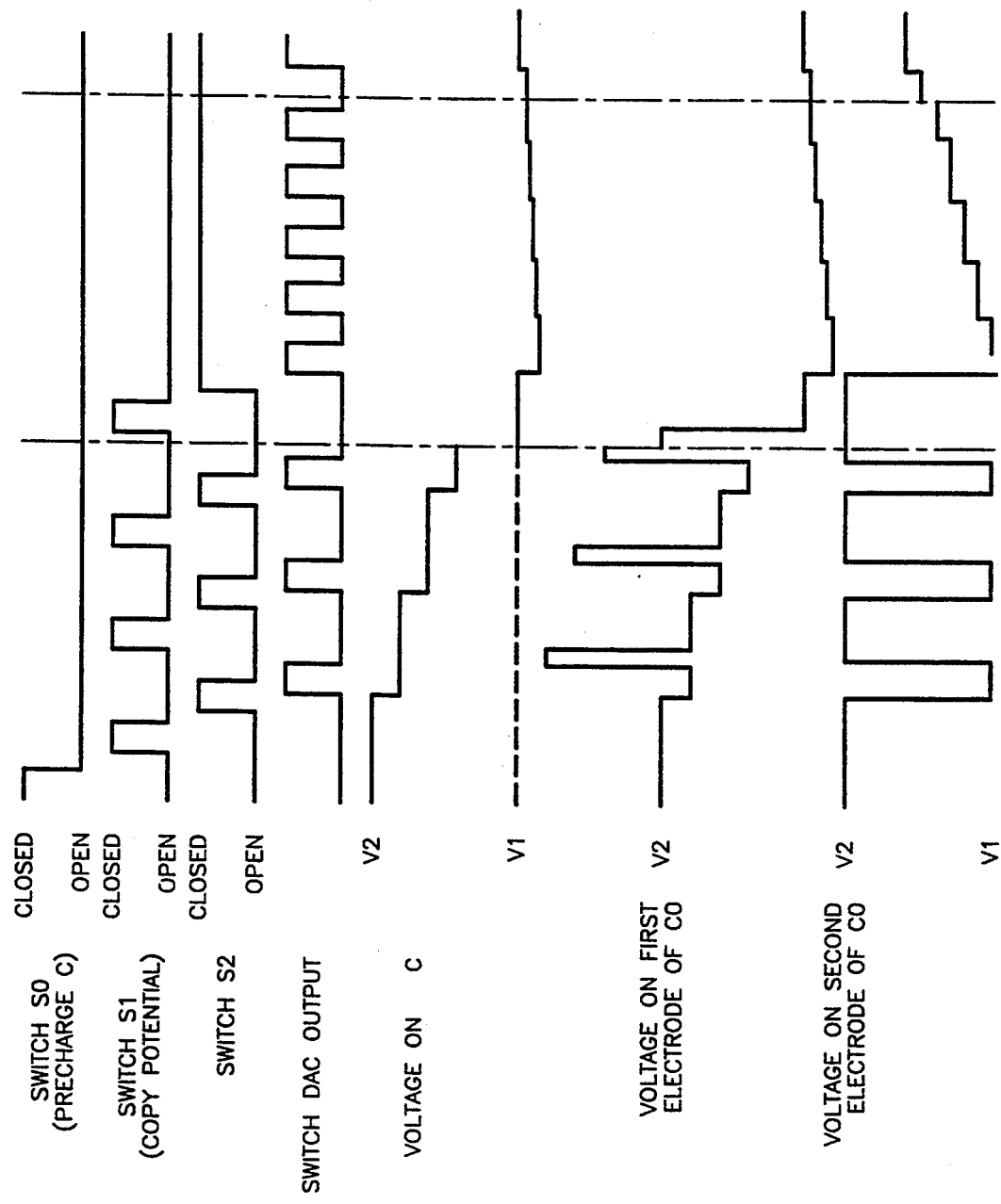

With reference to the timing diagrams of FIGS. 5–7, the sequencer 140 can cause the output 122 of the converter 120 to pass from the first voltage E1 to the second voltage E2 either after switch S2 has closed, as shown in the accompanying figures, or before it closes. In particular, the timing diagrams show the voltage on the second electrode of the capacitance C0 as it changes between V1 and V2. This voltage is the same as the output of the converter 120. It should be noted, however, that the drawings assume that E1 and E2 are respectively equal to V1 and V2. Nevertheless, the sequencer 140 must ensure that the output 122 of the converter 120 comes back down from the voltage E2 to the voltage E1 only after the switch S2 has opened.

In FIG. 2, the step during which the output 122 of the converter comes down from voltage E2 to voltage E1 is referenced 217. The instant at which the voltage comes down is referenced T7 in FIG. 5.

Thus, during each measurement cycle 210, the voltage across the terminals of the capacitance C being measured is incremented by a voltage step having the following value:

(1) $(E2-E1)C0/(C+C0)$

As a result, after N measurement cycles 210, the voltage across the terminals of the capacitance C being measured has been incremented by:

(2) $N(E2-E1)C0/(C+C0)$

Since the initial voltage across the terminals of the capacitance is V1, the voltage across the terminals of the capacitance to be measured C after N measurement cycles 210 is equal to:

(3) $V1+[N(E2-E1)C0]/(C+C0)$, i.e.

(4) $E1+[N(E2-E1)C0]/(C+C0)$ if $E1=V1$.

The above-described measurement cycles 210 are stopped by the sequencer 140 when the comparator OP130 changes state, i.e. when the voltage across the terminals of the capacitance to be measured C exceeds the reference voltage V2. When this occurs, the polarity between the input terminals of the comparator OP130 changes, and this in turn results in a change in the output of the comparator OP130 from saturation of a first polarity, to saturation of an opposite polarity. This instant is referenced T8 in FIG. 5.

In addition, instants T'2 to T'7 of the second measurement cycle 210 respectively corresponding to above-described instants T2 to T7 are shown in FIG. 5, as are instants T2N, T3N, T4N, and T7N of the N-th measurement cycle respectively corresponding to above-mentioned instants T2, T3, T4, and T7.

The step of comparing the voltage across the terminals of the capacitance C and the reference voltage V2 is referenced 215 in FIG. 2.

From the above equations, it is deduced that:

(5) $V1+[N(E2-E1)C0]/(C+C0) \approx V2$, i.e.

(6) $C \approx C0(N-1)$

The above-mentioned steps of the method are shown in FIG. 2, and the corresponding timing chart is given in FIG. 5. In FIG. 2, box 220 reproduces equations (5) and (6) above, while step 218 corresponds to the iteration loop being closed.

Nevertheless, above-mentioned equation (6) suffers from an error due to the fact that when the comparator OP130 changes state, the voltage across terminals of the capacitance C exceeds the reference voltage V2 by an overshoot amount D which is at most equal to the voltage step size as defined by equation (1).

Thus:

(7) $V1+[N(E2-E1)C0]/(C+C0)=V2+D$, i.e. if $V1=E1$ and $V2=E2$:

(8) $E1+[N(E2-E1)C0]/(C+C0)=E2+D$

To eliminate the error due to the overshoot D, and while keeping the switch S2 closed, the sequencer 140 causes the output 122 of the converter 120 to go progressively down from the potential E2 towards the potential E1 in voltage steps of:

(9) $(E2-E1)C0/(C+C0)(2^M-1)$ where M is the number of bits used by the converter 120.

The progressive drop in output voltage from the converter 120 serves to measure the value of the above-mentioned overshoot D.

Figure 3:
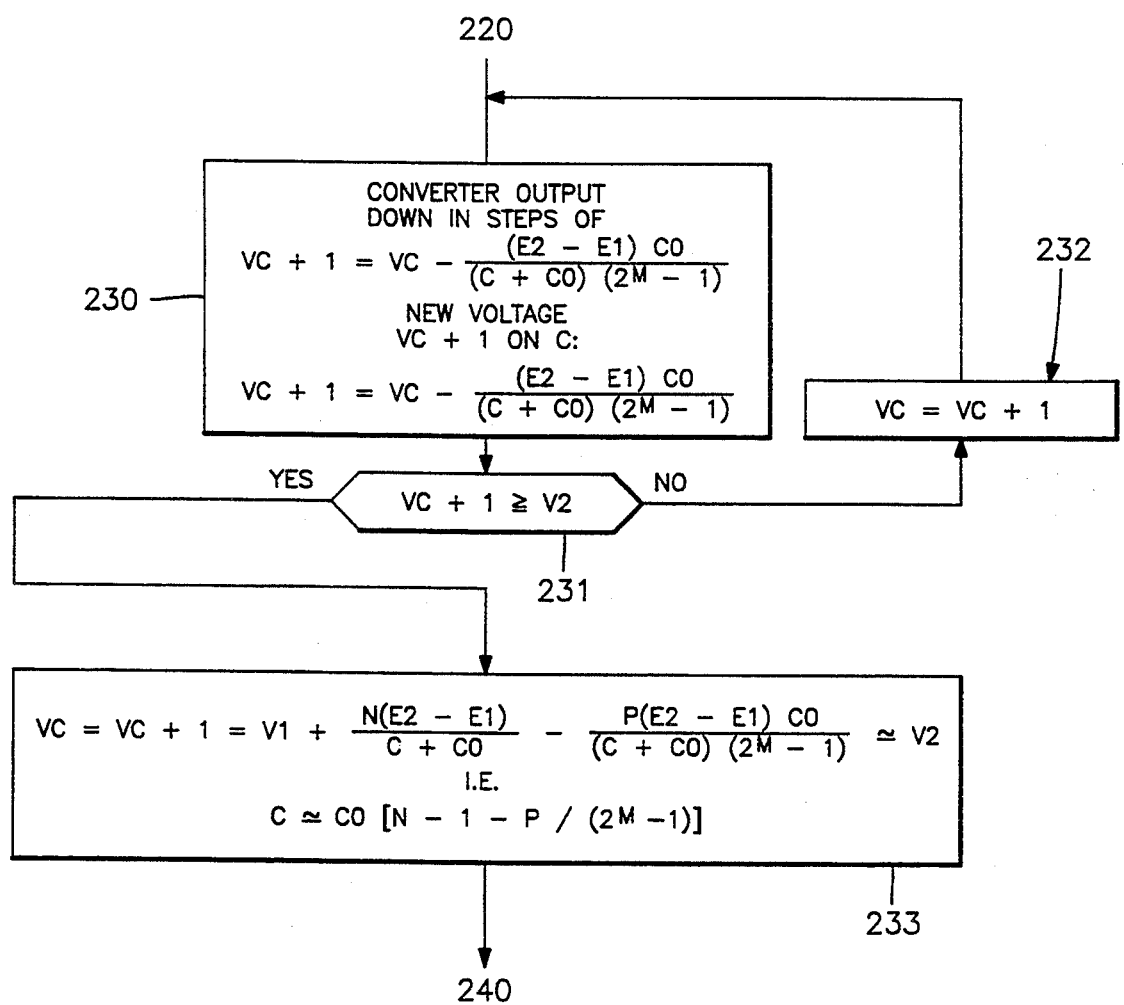

The successive stages during which the output 122 of the converter 120 goes down are referenced 230 in FIG. 3. In FIG. 6, the instants at which the output 122 of the converter 120 goes down by one step are referenced T9. The sequencer 140 stops the converter 120 changing when the comparator OP130 changes state again after P decrements, i.e. when the voltage across the terminals of the capacitance C goes back below the reference voltage V2. This instant is referenced T9P in FIG. 6. At this point:

(10) $D=P(E2-E1)C0/(C+C0)(2^M-1)$

By combining equations (8) and (9) the following is obtained:

(11) $E1+[N(E2-E1)C0]/(C+C0)=E1+[P(E2-E1)C0]/(C+C0)(2^M-1)$, i.e.:

(12) $C=C0[N-1P/(2^M-1)]$

In FIG. 3, the step of comparing the voltage across the terminals of the capacitance C with the reference voltage V2 is referenced 231. Reference 232 designates iterating moving the output 122 of the converter 120 down one voltage step. Box 233 reproduces above equations (11) and (12).

The capacitance C is now known accurately since all of the parameters in equation (12) are known:

N is the number of measurement cycles 210;

P is the number of output decrements of the converter; and

M is the number of bits converted by the converter 120.

The value C given by equation (12) and obtained by the above-described method is directly usable. Nevertheless, above equation (12) still suffers from an error due to the offset voltage V0 of the comparator OP130.

Because of this offset voltage V0, equation (8) should, in fact, be written:

(13) $E1+[N(E2-E1)C0]/(C+C0)=E2+D+V0$

Which, by combining equations (13) and (10) leads to:

(14) $E1+[N(E2-E1)C0]/(C+C0)=E2+[P(E2-E1)C0]/(C+C0)(2^M-1)+V0$, i.e.,

(15) $C=[(E2-E1)/(E2-E1+V0)]C0[N-1-P/(2^M-1)-V0/(E2-E1)]$

To eliminate this error, the Applicant proposes iterating the previous steps after interchanging the reference voltages E1 and E2.

This new stage gives rise to an equation (16) which is similar to above equation (14) apart from a question of sign, i.e.:

(16) $E2+[Q(E1-E2)C0]/(C+C0)=E1+[R(E1-E2)C0]/(C+C0)(2^M-1)+V0$ where Q and R are numbers of iterations corresponding to N and P respectively.

By combining equations (14) and (16), the following is obtained:

(17) $[(N+Q)(E2-E1)C0]/(C+C0)=2(E2-E1)+[(P+R)(E2-E1)C0]/(C+C0)(2^M-1)$

The offset voltage V0 is thus eliminated from (17) and it can be deduced that:

(18) $C=C0[(N+Q)/2-1-(P+R)/2(2^M-1)]$

Figure 4:
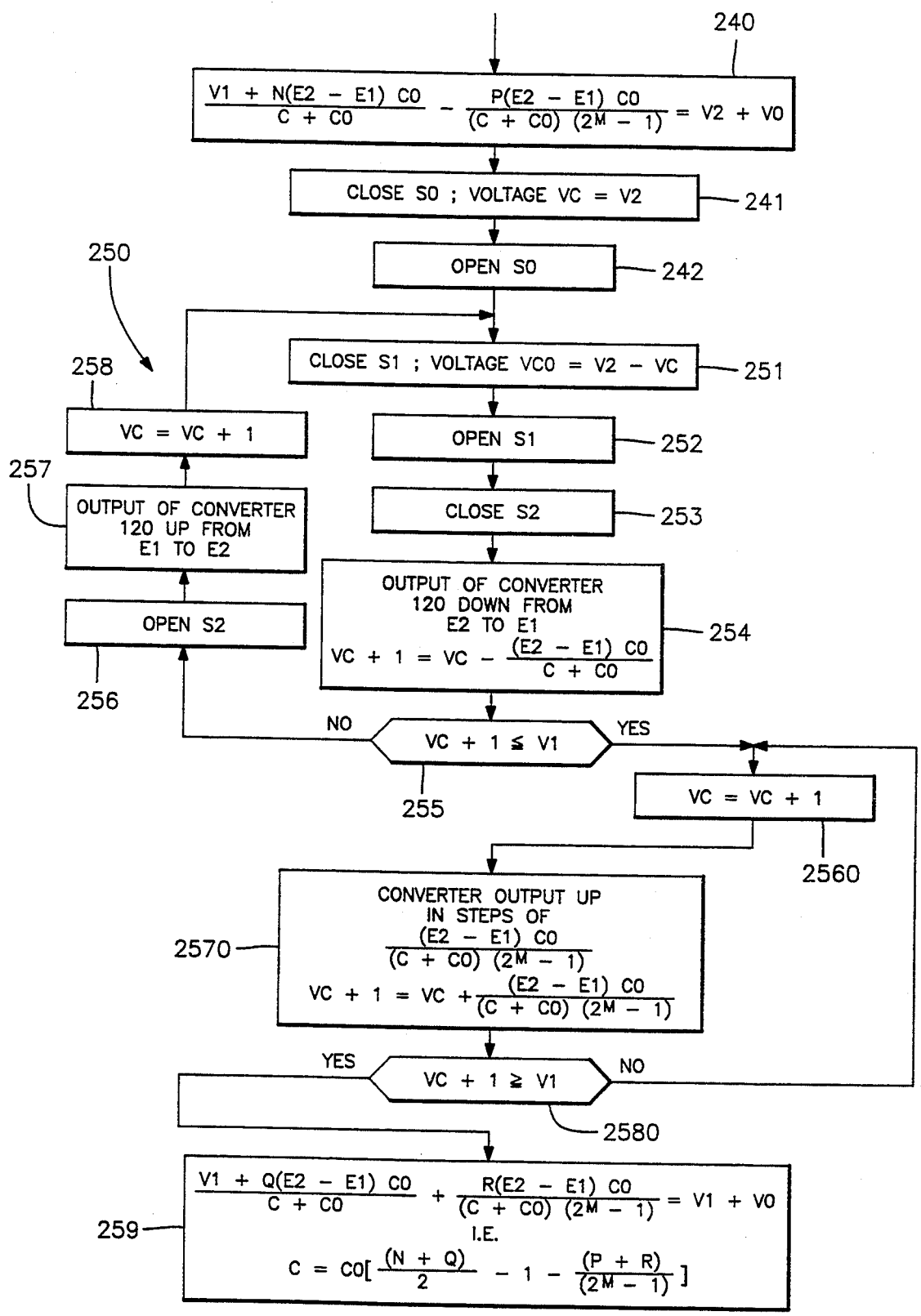

This new stage of iterating the previous steps after interchanging the reference voltages E1 and E2 is shown by the flow chart of FIG. 4 and by the timing diagram of FIG. 7. It should be noted however that, contrary to FIG. 1 and because of the interchange of voltages during the new stage of iterating, the reference voltage V1 is applied at terminal 106, while the reference voltage V2 is applied at terminal 104.

In FIG. 4, equation (14) is recalled in box 240.

This new stage begins firstly with the initialization step 241 in which the switch S0 is closed to connect the second electrode 103 of the capacitance to be measured C to the reference voltage V2, which most preferably is equal to the voltage E2. The capacitance to be measured C is thus precharged to a second known voltage V2.

The switch S0 is then opened at step 242.

The sequencer 140 then runs iteration cycles 250 similar to the above-described cycles 210.

Each cycle 250 comprises in succession:

step 251 in which switch S1 is closed so that the output from the operational amplifier OP110 is applied to the first electrode 111 of the reference capacitance C0. As a result, the potential V2 present on the second electrode 103 of the capacitance to be measured C is applied to the first electrode 111 of the reference capacitance C0; during this step 251, the potential present on the second electrode 112 of the reference capacitance C0 is equal to the voltage E2;

step 252 in which switch S1 is opened;

step 253 in which switch S2 is closed, to transfer charge to the reference capacitance C0 from the capacitance to be measured C;

step 255 consisting in using the operational amplifier OP130 to compare the voltage present on the second electrode 103 of the capacitance to be measured C with the reference voltage V1; naturally, to do this the sequencer 140 will previously have replaced the earlier potential V2 by the potential V1 on the inverting input of the operational amplifier OP130, and similarly it will previously have replaced the earlier potential V1 by the potential V2 on terminal 104;

step 256 consisting in opening switch S2 if step 255 indicates that the potential on the second electrode 103 of the capacitance to be measured C remains greater than the voltage V1; and step 257 consisting in switching the voltage at the output 122 of the converter 120 from the first voltage E1 to the voltage E2.

In FIG. 4, step 258 symbolizes the end of one iteration 250.

On each iteration 250, the potential on the capacitance to be measured C is reduced by:

(19) $(E2-E1)C0/(C+C0)$

Consequently, at the end of the iterations 250, the potential across terminals of the capacitance C is equal to:

(20) $V2-Q(E2-E1)C0/(C+C0)$ in which equation Q represents the number of iterations 250.

The potential then present across the terminals of the capacitance differs from the value V1 by a magnitude that is no greater than the voltage step size defined by equation (19).

As in the earlier steps, the sequencer 140 can cause the output 122 of the converter 120 to switch from the voltage E2 to the voltage E1 either after closing the switch S2 as shown in the accompanying figures, or else beforehand. In any event, it is necessary for the sequencer 140 to cause the output 122 of the converter 120 to go up from voltage E1 to voltage E2 (step 257) only after switch S2 has been opened (step 256).

The sequencer then passes to steps 2560 and 2570 if the comparator OP130 observes in step 255 that the voltage across the terminals of the capacitance to be measured C has become less than the reference voltage V1. Step 2570 consists in progressively raising the output 122 of the converter 120 by steps equal in size to those defined above by equation (9).

Step 2570 is iterated so long as subsequent step 2580 indicates that the voltage across the terminals of the capacitance to be measured C has not yet become greater than the reference voltage V1. The number of iterations through 2570 is counted and is written R, as mentioned above.

When step 2580 indicates that the voltage across the terminals of the capacitance to be measured C has again become greater than the reference voltage V1, then above-mentioned equations (16) and (18) as reproduced in box 259 of FIG. 4 again apply.

The sequencer 140 is associated with calculation means suitable for determining the capacitance to be measured C on the basis of equations (6), (12), or (18).

Naturally, the use of equation (18) is preferred in that it makes it possible to eliminate the offset voltage of the comparator OP130 and consequently provides a result that is accurate.

In the description above, the capacitance to be measured C is precharged, and the reference capacitance C0 is used to transfer charge to the capacitance to be measured C.

It would nevertheless be possible in the circuit of FIG. 1 to interchange the positions of the capacitance to be measured C and the reference capacitance C0. Under such circumstances, the reference capacitance C0 is precharged and the capacitance to be measured C is used for transferring charge to the reference capacitance C0. Naturally, under such circumstances, the parameters C and C0 need to be interchanged in equations (6), (12), and (18).

The present invention is naturally not limited to the particular embodiment described above, but extends to any variant within the spirit of the invention.

The present invention may be applied to measuring the capacitance of any type of capacitor. In particular, but not exclusively, it may be used for measuring the capacitance of capacitive probes for measuring liquid level such as described, for example, in the following documents: FR-A-2 234 555, FR-A-2 402 193, FR-A-2 451 024, FR-A-2 500 169, and FR-A-2 500 337, or as described in the following French patent applications filed by the present Applicant on May 31, 1989 under the numbers: 89 07164, 89 07165, and 89 07166.

Capacitive probes for measuring liquid levels generally comprise a plurality of capacitances, as mentioned in the above documents. Under such circumstances, an analog multiplexer may be connected between these various different capacitances and the measuring apparatus of the present invention so as to enable a single measuring apparatus to measure the different capacitances in succession.

I claim:

1. A method of measuring a capacitance of a capacitor, the method making use of a reference capacitor having a reference capacitance in addition to the capacitance of the capacitor to be measured, the reference capacitor and the capacitor to be measured each having first and second electrodes on opposite sides thereof, the method comprising the following steps:

(a) precharging a second electrode of a first one of the capacitors to a first predetermined potential, said first capacitor having its first electrode connected to ground;

(b) charging the first electrode of the second one of the capacitors to the same potential as the second electrode of the first capacitor without changing the potential on said second electrode of the first capacitor;

(c) electrically connecting the first electrode of the second capacitor to the second electrode of the first capacitor so that the potential on the second electrode of the first capacitor is equal to the potential on the first electrode of the second capacitor, and switching the potential on the second electrode of the second capacitor between a first predetermined value and a second predetermined value; and (d) comparing the potential on the second electrode of the first capacitor with a reference potential, disconnecting the first electrode of the second capacitor with the second electrode of the first capacitor and iterating above steps (b) and (c) until the potential on the second electrode of the first capacitor passes through a level corresponding to the reference potential, and counting the number of iterations, said number of iterations being indicative of the ratio of capacitance between the two capacitors and consequently of the capacitance of the capacitor to be measured when the reference capacitance is known.

2. A method according to claim 1, wherein said first predetermined potential is equal to said first predetermined value.

3. A method according to claim 1, wherein the reference potential is equal to said second predetermined value.

4. A method according to claim 1, wherein said first predetermined value is less than said second predetermined value.

5. A method according to claim 1, wherein said second electrode of the first capacitor is electrically connected to an input terminal of a follower amplifier, the output of said follower amplifier being connected through a switch to said first electrode of the second capacitor, said step (b) comprising closing said switch so that the first electrode of the second capacitor is electrically connected to the output of the follower amplifier.

6. A method according to claim 1, wherein the potential on the second electrode of the second capacitor is switched during step (c) from the first predetermined value to the second predetermined value after the first electrode of the second capacitor has been connected to the second electrode of the first capacitor.

7. A method according to claim 1, wherein the potential on the second electrode of the second capacitor is switched during step (c) from the first predetermined value to the second predetermined value before the first electrode of the second capacitor has been connected to the second electrode of the first capacitor.

8. A method according to claim 1, wherein after step (c) the potential on the second electrode of the second capacitor is returned from the second predetermined value to the first predetermined value after the first electrode of the second capacitor has been electrically disconnected from the second electrode of the first capacitor.

9. A method according to claim 1, further including the following step:
(e) causing the potential on the second electrode of the second capacitor to change in voltage steps from the second predetermined value toward the first predetermined value until the potential on the second electrode of the first capacitor is again detected as passing through a level corresponding to the reference potential, and counting the number of voltage steps performed, said number of voltage steps being further indicative of the ratio between the two capacitors and consequently of the capacitance to be measured when the reference capacitor and number of iterations counted in step (d) are known.

10. A method according to claim 9, wherein the capacitance to be measured is determined on the basis of the following equation:

$$C = CO\{N - 1 - P/(2^M - 1)\}$$

in which:
CO represents the reference capacitance;
N represents the number of iterations of steps (b) and (c);
P represents the number of voltage steps used in step (e); and
$(2^M - 1)$ represents the number of voltage steps between the first predetermined value and the second predetermined value.

11. A method according to claim 9 wherein said first predetermined value is less than said second predetermined value and said step (e) comprises detecting when the potential on the second electrode of the first capacitor passes under said reference potential.

12. A method according to claim 9 wherein said first predetermined value is above said second predetermined value and said step (e) comprises detecting when the potential on the second electrode of the first capacitor passes above said reference potential.

13. A method according to claim 9, wherein said steps a, b, c, d, and e are then reproduced after interchanging said first predetermined value and said second predetermined value.

14. A method according to claim 1, wherein the capacitance to be measured is determined on the basis of the equation:

$$C \approx CO(N-1)$$

in which equation:
CO represents the reference capacitance; and
N represents the number of iterations of steps (b) and (c).

15. A method according to claim 1, wherein the first capacitance of the first capacitor is the capacitance to be measured.

16. A method according to claim 1, wherein the potential on the second electrode of the second capacitor is returned from the second predetermined value to the first predetermined value after the first electrode of the second capacitor has been electrically disconnected from the second electrode of the first capacitor before each iteration of steps (b) and (c); and further comprising the steps of:
(e) causing the potential on the second electrode of the second capacitor to change in voltage steps from the second predetermined value toward the first predetermined value until the potential on the second electrode of the first capacitor is detected as exceeding the reference potential, and counting the number of voltage steps performed, said number of voltage steps performed being further indicative of the ratio between the two capacitors and consequently of the capacitance to be measured when the reference capacitance and number of iterations counted in step (d) are known;
(f) precharging the second electrode of said first capacitor to said reference potential;
(g) changing the first electrode of the second capacitor to the same potential as the second electrode of the first capacitor;
(h) connecting the first electrode of the second capacitor to the second electrode of the first capacitor and switching the potential on the second electrode of the second capacitor between the second predetermined value and the first predetermined value; and
(i) comparing the potential on the second electrode of the first capacitor with the first predetermined potential, and iterating said steps (g) and (h) until the potential on the second electrode of the first capacitor passes through a level corresponding to the first predetermined potential, and counting the number of iterations of steps (g) and (h), the potential on the second electrode of the second capacitor being returned from the first predetermined value to the second predetermined value after the first electrode of the second capacitor has been electrically disconnected from the second electrode of the first capacitor; and
(j) causing the potential on the second electrode of the second capacitor to change in voltage steps from the first predetermined value toward the second predetermined value until the potential on the second electrode of the first capacitor is again detected as passing through a level corresponding to the first predetermined potential, and counting the number of voltage steps performed, said number of voltage steps in step (j) and said number of iterations of steps (g) and (h) being even further indicative of said capacitor to be measured whenever the reference capacitor, the number of iterations counted in step (d), and the number of voltage steps in step (e) are known.

17. A method according to claim 16, wherein
the reference potential is equal to the second predetermined value; and
the first predetermined potential is equal to the first predetermined value.

18. A method according to claim 16, wherein the capacitance to be measured is determined on the basis of the following equation:

$$C = CO\{(N+Q)/2 - 1 - (P+R)/2(2^M - 1)\}$$

in which

CO represents the reference capacitance;

N represents the number of iterations of steps (b) and (c);

Q represents the number of iterations of steps (g) and (h);

P represents the number of voltage steps performed in step (e); and

R represents the number of voltage steps performed in step (j); and $(2^M-1)$ represents the number of voltage steps between the first predetermined value and the second predetermined value.

19. A method according to claim 1 wherein said first predetermined value is less than said second predetermined value and said step (d) of comparing the potential on the second electrode of the first capacitor with a reference potential comprises detecting when the potential on the second electrode of the first capacitor passes above said reference potential.

20. A method according to claim 1 wherein said first predetermined value is above said second predetermined value and said step (d) of comparing the potential on the second electrode of the first capacitor with a reference potential comprises detecting when the potential on the second electrode of the first capacitor passes under said reference potential.

21. Apparatus for measuring a capacitance of a capacitor using a reference capacitor having a reference capacitance, comprising:

precharging a second electrode of means for precharging a first one of said capacitors to a first predetermined potential, said first capacitor having a first electrode connected to ground;

charging means for selectively charging a first electrode of a second one of said capacitors to the same potential as the second electrode of the first capacitor, without changing the potential of the second electrode of the first capacitor;

connecting means for selectively electrically connecting the first electrode of the second capacitor to the second electrode of the first capacitor;

potential changing means for switching the potential on the second electrode of the second capacitor between a first predetermined value and a second predetermined value;

comparator means for comparing the potential on the second electrode of the first capacitor to a reference potential; and sequencer means responsive to the output from the comparator means for controlling the charging means, the connecting means, and the potential changing means, and for counting the number of times each is used.

22. Apparatus according to claim 21, wherein the potential changing means is controlled by the sequencing means so that the potential on the second electrode of the second capacitor changes in voltage steps, from the second predetermined value toward the first predetermined value.

23. Apparatus according to claim 21, wherein the potential changing means is controlled by the sequencer means so that the potential on the second electrode of the second capacitor selectively switches between the second predetermined value and the first predetermined value, and then changes in voltage steps from the first predetermined value toward the second predetermined value.

24. Apparatus according to claim 21, wherein the precharging means include a switch.

25. Apparatus according to claim 24, wherein the switch of the precharging means electrically connects the second electrode of the first capacitor either to a potential equal to the first predetermined value or else to a potential equal to the second predetermined value.

26. Apparatus according to claim 21, wherein the charging means comprise a follower operational amplifier having an input electrically connected to the second electrode of said first capacitor and an output electrically connected through a switch to the first electrode of said second capacitor.

27. Apparatus according to claim 21, wherein the connecting means comprise a switch.

28. Apparatus according to claim 21, including means suitable for measuring the capacitance to be measured on the basis of the following equation:

$$C=CO\{(N+Q)/2-1-(P+R)/2(2^M-1)\}$$

in which

CO represents the reference capacitance;

N represents the number of iterations of steps (b) and (c);

Q represents the number of iterations of steps (g) and (h);

P represents the number of voltage steps performed in step (e); and

R represents the number of voltage steps performed in step (j); and $(2^M-1)$ represents the number of voltage steps between the first predetermined value and the second predetermined value.

29. Apparatus according to claim 28, wherein the potential changing means comprise a digital-to-analog converter controlled by the sequencer means; and wherein M represents the number of bits of the digital-to-analog converter.

30. Apparatus according to claim 21, including means for determining the capacitance to be measured on the basis of the following equation:

$$C \approx CO(N-1)$$

in which equation:

CO represents the reference capacitance; and

N represents the number of iterations in steps (b) and (c).

31. Apparatus according to claim 21, including means suitable for determining the capacitance to be measured on the basis of the following equation:

$$C=CO\{N-1-P/(2^M-1)\}$$

in which:

CO represents the reference capacitance;

N represents the number of iterations in steps (b) and (c);

P represents the number of voltage steps used in step (e); and $(2^M-1)$ represents the number of voltage steps between the first predetermined value and the second predetermined value.

32. Apparatus according to claim 21, wherein the potential changing means comprise a digital-to-analog converter controlled by the sequencer means.

* * * * *